United States Patent
Wei et al.

(10) Patent No.: US 10,901,258 B2
(45) Date of Patent: Jan. 26, 2021

(54) DISPLAY MODULE AND DISPLAY DEVICE

(71) Applicant: Beijing Xiaomi Mobile Software Co., Ltd., Beijing (CN)

(72) Inventors: Shujun Wei, Beijing (CN); Jian Bai, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/670,315

(22) Filed: Oct. 31, 2019

(65) Prior Publication Data

US 2020/0379295 A1 Dec. 3, 2020

(30) Foreign Application Priority Data

May 31, 2019 (CN) .......................... 2019 1 0473195

(51) Int. Cl.
  *G02F 1/1335* (2006.01)
  *G02F 1/1333* (2006.01)

(52) U.S. Cl.
  CPC .... *G02F 1/133528* (2013.01); *G02F 1/13338* (2013.01); *G02F 2001/133331* (2013.01); *G02F 2202/28* (2013.01)

(58) Field of Classification Search
  CPC ... G02F 2001/133331; G02F 1/133528; G02F 1/13362; G02B 5/3033; G02B 5/3025; G02B 27/26; Y10T 428/1041
  See application file for complete search history.

(56) References Cited

U.S. PATENT DOCUMENTS

| | | | |
|---|---|---|---|
| 9,507,203 B2 | 11/2016 | Tamaki et al. | |
| 10,025,145 B2 | 7/2018 | Tamaki et al. | |
| 2002/0171081 A1 | 11/2002 | Vincent et al. | |
| 2002/0171907 A1 | 11/2002 | Vincent et al. | |
| 2005/0128560 A1 | 6/2005 | Vincent et al. | |
| 2010/0277788 A1 | 11/2010 | Webb et al. | |

(Continued)

FOREIGN PATENT DOCUMENTS

| CN | 108254963 A | 7/2018 |
|---|---|---|
| CN | 108594524 A | 9/2018 |

(Continued)

OTHER PUBLICATIONS

European Search Report in the European Application No. 19210669.8, dated Mar. 3, 2020.

(Continued)

*Primary Examiner* — Jia X Pan
(74) *Attorney, Agent, or Firm* — Finnegan, Henderson, Farabow, Garrett & Dunner, L.L.P.

(57) ABSTRACT

A display module includes: cover glass, a first region of an inner surface of the display module covering a photosensitive surface of an image acquisition module and the inner surface opposite to an outer surface of the display module; a display component configured to display in a display region; a polarization component, located between the display component and the cover glass and for filtering ambient light reflected from the display component based on a polarization action in the display region outside a second region covering the first region; and an electrochromic component, located between the cover glass and the display component, adjacent to the polarization component and filling the second region.

20 Claims, 10 Drawing Sheets

(56) References Cited

U.S. PATENT DOCUMENTS

| | | |
|---|---|---|
| 2014/0285761 A1 | 9/2014 | Tamaki et al. |
| 2015/0077830 A1* | 3/2015 | Lin .................. G02F 1/163 |
| | | 359/275 |
| 2017/0045786 A1 | 2/2017 | Tamaki et al. |
| 2017/0123575 A1* | 5/2017 | Evans, V ............. H04N 5/2254 |
| 2019/0208044 A1* | 7/2019 | Lee .................. G06F 1/1684 |
| 2020/0073190 A1* | 3/2020 | Zhang ................. G02F 1/153 |
| 2020/0160775 A1* | 5/2020 | Zhang ............... H01L 27/3232 |
| 2020/0213492 A1* | 7/2020 | Yang ................. G03B 17/02 |
| 2020/0243794 A1* | 7/2020 | Jones ............... G02F 1/13338 |

FOREIGN PATENT DOCUMENTS

| | | |
|---|---|---|
| CN | 109034103 A | 12/2018 |
| CN | 109116656 A | 1/2019 |
| CN | 109407375 A | 3/2019 |
| CN | 109613780 A | 4/2019 |
| EP | 3618050 A2 | 3/2020 |
| RU | 91443 U1 | 2/2010 |
| WO | WO 2019/058106 A1 | 3/2019 |
| WO | WO 2019/205627 A1 | 10/2019 |

OTHER PUBLICATIONS

Notice of Allowance of the Russian Application No. 2019136638, dated May 21, 2020.
International Search Report in International Application No. PCT/CN2019/098743, dated Mar. 18, 2020.

* cited by examiner

Region for arrangement of image acquisition module

DISPLAY MODULE AND DISPLAY DEVICE

CROSS-REFERENCE TO RELATED APPLICATION

This application is based upon and claims priority to Chinese Patent Application No. 201910473195.4, filed on May 31, 2019, the entire contents of which are incorporated herein by reference.

TECHNICAL FIELD

The present disclosure generally relates to the technical field of display, and more particularly, to a display module and a display device.

BACKGROUND

Along with development of full screen technologies, if a front camera of a device, such as a mobile terminal, directly occupies an area of a front surface of the device, a screen-to-body ratio of the device may get reduced. If the camera is arranged under a screen, the camera can be seen clearly in a screen-off state, which affects integrity of the screen of the device and brings degraded user experience.

SUMMARY

According to a first aspect of the embodiments of the present disclosure, a display module may include: cover glass, located on an outer surface of the display module and configured to protect the display module, a first region of an inner surface of the display module covering a photosensitive surface of an image acquisition module and the inner surface of the display module being a surface opposite to the outer surface of the display module; a display component, configured to display in a display region; a polarization component, located between the display component and the cover glass, the polarization component being configured to filter ambient light reflected from the display component based on a polarization action in the display region outside a second region and the second region being a region covering the first region in the display module; and an electrochromic component, located between the cover glass and the display component, adjacent to the polarization component and filling the second region, the electrochromic component being configured to, based on an applied electric signal, present first transparency when the display module is in a screen-on state or the image acquisition module is in an image acquisition state and present second transparency when the display module is in a screen-off state and the second transparency being lower than the first transparency.

According to a second aspect of the embodiments of the present disclosure, a display device may include: a display module including: cover glass, located on an outer surface of the display module and configured to protect the display module, wherein the outer surface of the display module is a surface opposite to an inner surface of the display module; a display component, configured for displaying in a display region; a polarization component, located between the display component and the cover glass and configured to filter ambient light reflected from the display component based on a polarization action in the display region outside a second region, wherein the second region is a region covering a first region of the inner surface of the display module; and an electrochromic component, located between the cover glass and the display component, adjacent to the polarization component and filling the second region, wherein the electrochromic component is configured to, based on an applied electric signal, present first transparency when the display module is in a screen-on state or the image acquisition module is in an image acquisition state and present second transparency when the display module is in a screen-off state, the second transparency being lower than the first transparency. The display device may also include an image acquisition module, having a photosensitive surface for sensing ambient light to form an image, the photosensitive surface being covered with the first region of the inner surface of the display module; and a processing module electrically connected with the display module and the image acquisition module and configured to control the electrochromic component in the display module to present the first transparency when the display module is in the screen-on state or the image acquisition module is in the image acquisition state and present the second transparency when the display module is in the screen-off state.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Terms used in the present disclosure are only adopted for the purpose of describing specific embodiments and not intended to limit the present disclosure. "A/an" and "the" in a singular form in the present disclosure and the appended claims are also intended to include a plural form, unless other meanings are clearly denoted throughout the present disclosure. It is also to be understood that term "and/or" used in the present disclosure refers to and includes one or any or all possible combinations of multiple associated items that are listed.

It is to be understood that, although terms "first", "second", "third" and the like may be adopted to describe various information in the present disclosure, the information should not be limited to these terms. These terms are only adopted to distinguish the information of the same type. For example, without departing from the scope of the present disclosure, first information may also be called second information and, similarly, second information may also be called first information. For example, the term "if" used here may be explained as "while" or "when" or "responsive to determining", which depends on the context.

Figure 1:
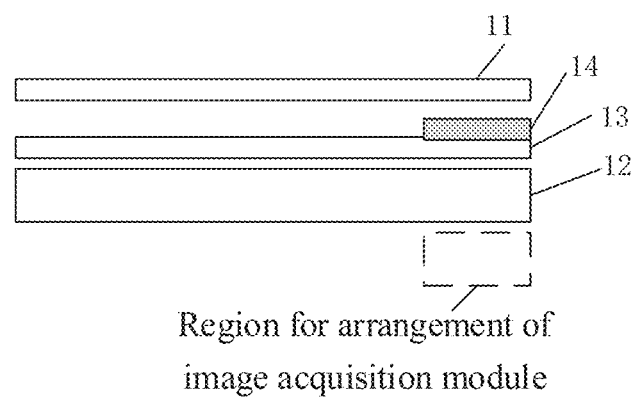
FIG. 1 is a schematic diagram of a display module, according to an exemplary embodiment.

FIG. 1 is a schematic diagram of a display module, according to an exemplary embodiment. The display module may include: a cover glass 11, located on an outer surface of the display module and configured to protect the display module, a first region of an inner surface of the display module covering a photosensitive surface of an image acquisition module, and the inner surface of the display module being opposite to the outer surface of the display module; a display component 12, configured for displaying in a display region; a polarization component 13, located between the display component 12 and the cover glass 11, the polarization component 13 being configured to filter ambient light reflected from the display component 12 based on a polarization action in the display region outside a second region, and the second region being a region covering the first region in the display module; and an electrochromic component 14, located between the cover glass 11 and the display component 12, adjacent to the polarization component 13 and filling the second region; the electrochromic component 14 being configured to, based on an applied electric signal, present first transparency when the display module is in a screen-on state or the image acquisition module is in an image acquisition state, and present second transparency when the display module is in a screen-off state, the second transparency being lower than the first transparency.

In the embodiment, the display component 12 includes a display array, and the display array consists of Organic Light-Emitting Diodes (OLEDs). The display component 12 is configured for displaying.

In the embodiment, the display component 12 is a transparent component capable of transmitting light. The image acquisition module located in the first region of the inner surface of the display module may perform image acquisition through the transparent display component 12.

The display component 12 may execute displaying when the display module is in the screen-on state, and may not execute displaying when the display module is in the screen-off state.

In the embodiment, the first region of the inner surface of the display module is opposite to the image acquisition module, and the first region covers the photosensitive surface of the image acquisition module. For example, the photosensitive surface of the image acquisition module faces the first region of the display component 12. The photosensitive surface may be an acquisition surface of the image acquisition module, and the acquisition surface may be configured to sense the ambient light and perform image acquisition based on the sensed ambient light.

The image acquisition module may be a front camera in a mobile terminal.

A vertical projection of the first region where the image acquisition module is located in the display module may be included in the second region.

In some embodiments, an area of the second region may be equal to an area of the first region, or, the area of the second region may be slightly larger than the area of the first region.

In the embodiment, the display module may enter a transparent state in the image acquisition state, so that the image acquisition module may perform image acquisition through an acquisition module.

In the embodiment, the polarization component 13 includes one or more polarization layers, and the one or more polarization layers may polarize light. Meanwhile, light transmittance of the polarization component 13 may not be high. For example, the light transmittance may be below 50%, e.g., below 50% or 30%.

The polarization component 13 may reduce part of ambient light incident into the display module based on low light transmittance, and on the other hand, may filter reflected light formed by the display component 12 from the incident ambient light through its own polarization action so as to prevent most of the reflected light from being projected into an environment and enable a user to see the display module through the outer surface of the display module.

In some embodiments, due to the low light transmittance of the polarization component 13, if the polarization component 13 is still arranged on the image acquisition module formed by one or more cameras, the image acquisition module may not perform image acquisition, or an acquired image may be quite low in brightness. In an embodiment, the polarization component 13 is configured to filter the light in the display region outside the second region, so that the polarization component 13 may not be located in the second region. Accordingly, the image acquisition module may perform image acquisition through the first region of the inner surface of the display module and the second region in the display module.

This means lack of the polarization action of the polarization component 13 in the second region. In some embodiments, if the display component 12 is in the screen-off state and the electrochromic component 14 is not arranged, a color difference or a transparency difference may be formed between the second region and the first region in the display region, even bringing a phenomenon that the image acquisition module or the display component is exposed through the second region.

In an embodiment, the second region is a sub-region of the display region, and the sub-region corresponds to the first region. The second region may be a region adapted to a shape and size of the image display module, such as a rectangular region, a round region or an elliptical region.

Figure 2:
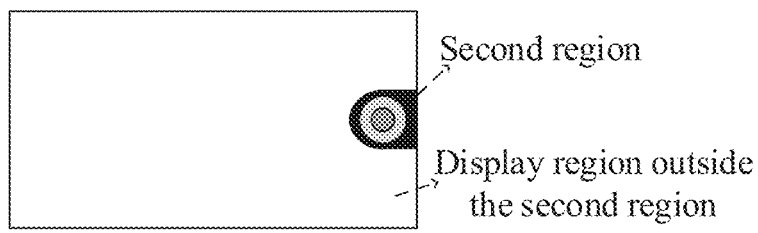
FIG. 2 is a schematic diagram illustrating an effect of a display module, according to an exemplary embodiment.

The image acquisition module in the embodiment may be a front camera of a display device. The second region and the display region outside the second region are shown in FIG. 2.

Figure 3A:
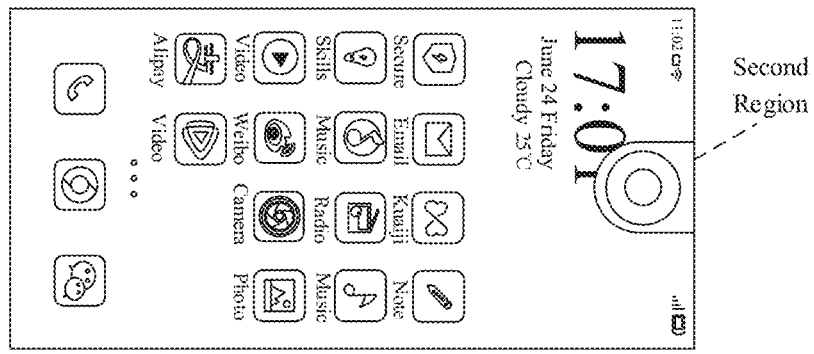
FIG. 3A is a schematic diagram illustrating an effect of a display module, according to an exemplary embodiment.

FIG. 3A is a schematic diagram of a desktop on a display, according to an exemplary embodiment. As shown in FIG. 3A, when the image acquisition module is not in the image acquisition state, both the second region and the display region outside the second region are in the screen-on state.

Figure 3B:
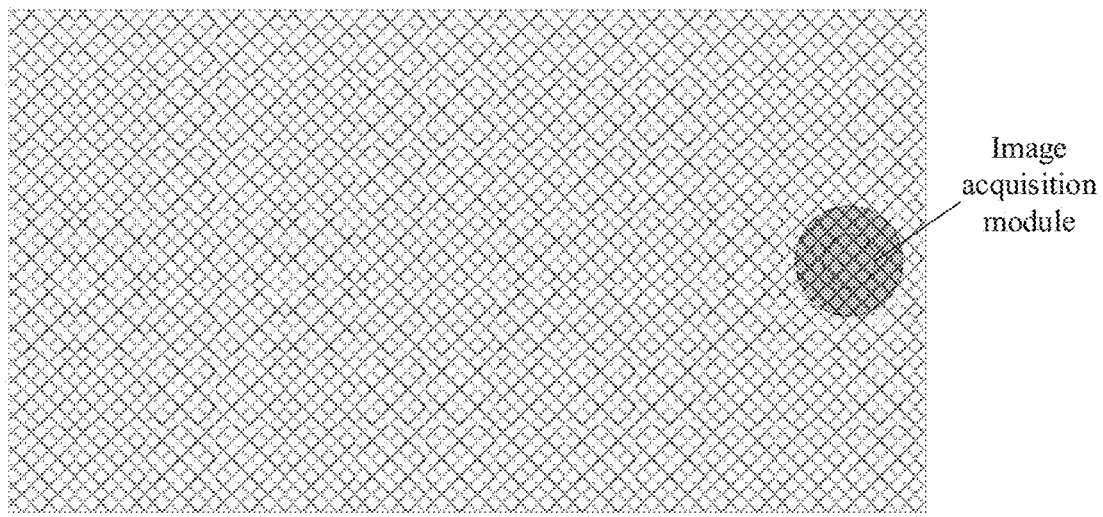
FIG. 3B is a schematic diagram illustrating an effect of a display module, according to an exemplary embodiment.

FIG. 3B is a schematic diagram of the image acquisition module in the first region when the display module is in the screen-off state (i.e., not in the screen-on state). When the display module provided in the embodiment of the present application is in the screen-off state, the image acquisition module is not exposed. In FIG. 3B, a position relationship between the image acquisition module and the display module is illustrated in a differentiated displaying manner. The effect shown in FIG. 3B is not an actual effect of the embodiment of the present application.

In the embodiment, the electrochromic component 14 is further introduced into the display module. The electrochromic component 14 is integrated and encapsulated into the display module, forming a part of the display module.

The electrochromic component 14 may change its own transparency according to the electric signal applied thereto, thereby enabling a user to visually perceive that other components located below it are presented or not presented.

The electrochromic component 14 may at least present different transparency when the electric signal is or is not applied or when different electric signals are applied.

In some embodiments, the electrochromic component 14 may have at least two states: one is a transparent state and the other is a nontransparent state. The first transparency is presented in the transparent state, and the second transparency is presented in the nontransparent state.

In some embodiments, the electrochromic component 14 may have more than two states, for example, including, but not limited to: 1): a transparent state, in which the light transmittance is relatively high and most or all of the light may substantially be transmitted; 2): a nontransparent state, in which the light transmittance is relatively low and light transmission is substantially not allowed or most of the light cannot pass through; and 3): a semitransparent intermediate state, which is an intermediate state between the transparent state and the nontransparent state and in which the light transmittance is lower than the light transmittance in the transparent state and higher than the light transmittance in the nontransparent state.

Here, the light transmittance indicates a probability that the light is transmitted through the electrochromic component 14.

In the embodiment, the electrochromic component 14 at least includes an electrochromic material, the electrochromic material including, but not limited to: a Polymer Dispersed Liquid Crystal (PDLC); a Suspended Particle Device (SPD); and an Electronic Control (EC) color changing material.

In the embodiment, the electrochromic component 14 is introduced into the display module, and the electrochromic component 14 may present different transparency when different electric signals are applied.

In the embodiment, when the display component 12 works or the image acquisition module is in the image acquisition state, high transparency may be presented, so that a display effect of the display module and an image acquisition effect of the image acquisition module can be ensured; and when the display component 12 is in the screen-off state, the transparency is reduced to ensure the same transparency and the same color tone for the whole display module, so that integrity of the display module is improved.

The electrochromic component 14 and the polarization component 13 may be arranged in, but not limited to, at least one of the following manners.

Figure 4:
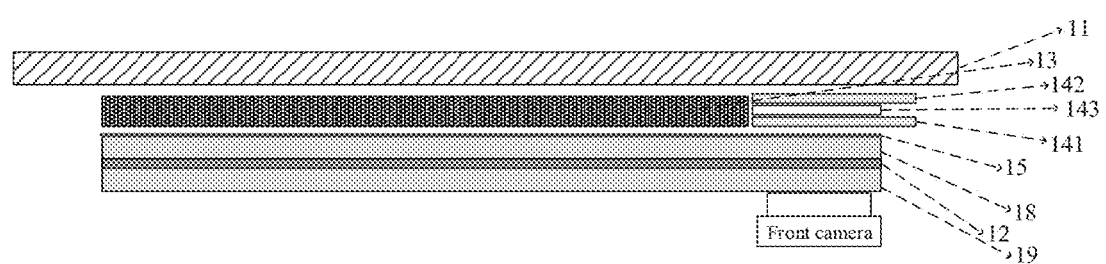
FIG. 4 is a schematic diagram of a display module, according to an exemplary embodiment.

In a first manner, the electrochromic component 14 and the polarization component 13 are arranged to be adjacent in a left-right direction; FIG. 4 is a schematic diagram of adjacent arrangement of the electrochromic component 14 and the polarization component 13 in the left-right direction.

Figure 5:
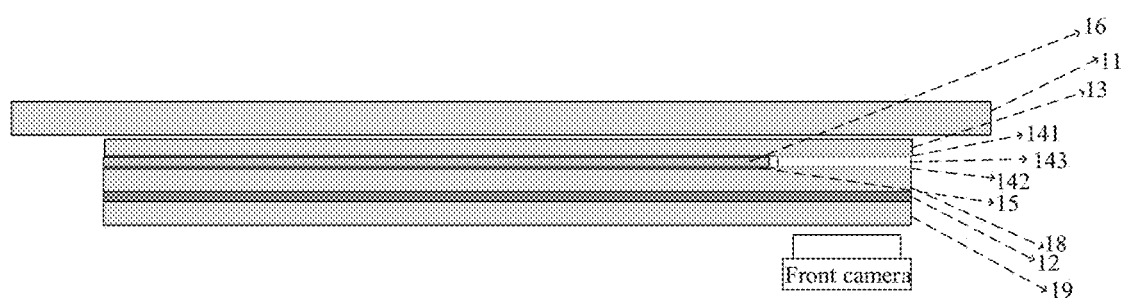
FIG. 5 is a schematic diagram of a display module, according to an exemplary embodiment.
Figure 6:
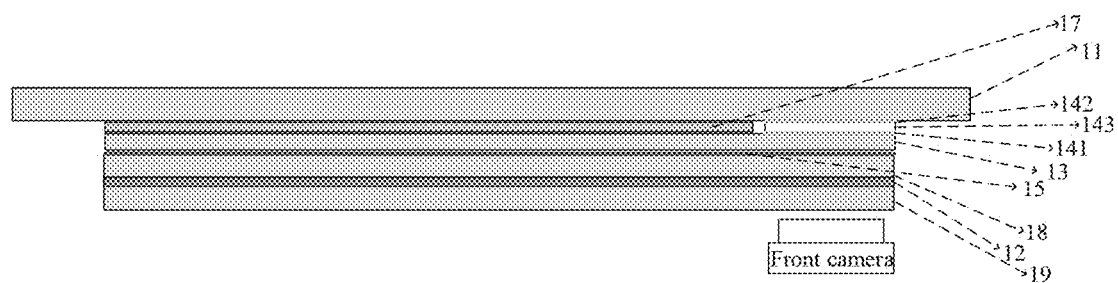
FIG. 6 is a schematic diagram of a display module, according to an exemplary embodiment.

In a second manner, the electrochromic component 14 and the polarization component 13 are arranged to be adjacent in a top-bottom direction; FIG. 5 and FIG. 6 are schematic diagrams of adjacent arrangement of the electrochromic component 14 and the polarization component 13 in the top-bottom direction.

In some embodiments, transparency achieved by filtering, by the polarization component 13, the ambient light reflected from the display component 12 based on the polarization action when the display module is in the screen-off state may be third transparency, a difference between the second transparency and the third transparency being within a preset range, so that the display module is high in integrity.

In some embodiments, the polarization component 13 may include: a polarization substrate, being a transparent glass plate or plastic plate, etc. and configured to provide a carrier for arrangement of a polarization layer; and the polarization layer, arranged on the polarization substrate and having the polarization action, the polarization layer being located in the display region outside the second region.

The polarization substrate may be a glass substrate or a plastic substrate.

The polarization substrate may be adhered, coated or plated with the polarization layer. The polarization layer may only allow light at a specific angle with respect to it to pass through, and not allow light at other incident angles to pass through. Therefore, on one hand, the light may be filtered based on the polarization component 13 to reduce incidence of the ambient light to the display component 12 through the display module, and the display component 12 with relatively high reflectivity may reflect the ambient light to reduce interference on displaying when there is more incident ambient light; and on the other hand, the phenomenon that pixels of the display component 12 are exposed in the screen-off state may be reduced.

In some embodiments, as shown in FIG. 4, the polarization substrate is located in the display region outside the second region; and the electrochromic component 14 and the polarization component 13 are arranged in parallel in a plane parallel to the display module, a first direction being a direction where a first side and a second side of the display component 12 are connected.

In the embodiment, the electrochromic component 14 and the polarization component 13 are arranged in parallel in the same plane.

For example, the electrochromic component 14 and the polarization component 13 may be arranged in parallel in a plane parallel to a display surface of the whole display module.

In the embodiment, the polarization component 13 may be located between the display component 12 and the cover glass 11, and similarly, the electrochromic component 14 and the polarization component 13 may be arranged in parallel between the display component 12 and the cover glass 11.

The display region may be divided into the second region and a third region, the third region being a region outside the second region. The whole polarization component 13 may be located in the third region, and the electrochromic component 14 may be located in the second region.

As shown in FIG. 4, the polarization component 13 and the electrochromic component 14 are arranged in parallel.

In FIG. 4, the electrochromic component 14 includes a first electrode layer 141, a second electrode layer 142 and an electrochromic material 143 located between the first electrode layer 141 and the second electrode layer 142.

The display module shown in FIG. 4 may further include a touch component 15. The touch component 15 may include, but not limited to, a Touch Panel (TP), and may detect various types of touch operations, for example, a point touch operation and/or a swipe operation.

In some embodiments, the touch component 15 may also be arranged outside the display module, for example, arranged between the polarization component 13 and the cover glass 11.

The display component 12 in FIG. 4 is an OLED display component 12. The OLED display component 12 may be a display component 12 of which display pixels are formed by OLED lamps.

The display module in FIG. 4 to FIG. 6 may be further integrated with encapsulation (ENCAP) glass 18. The display module in FIG. 4 to FIG. 6 may be further integrated with Low Temperature Poly-silicon (LTPS) glass 19.

In some embodiments, the polarization substrate may be located in the whole display region; and the electrochromic component 14 may include: a first electrode layer 141, arranged at a portion, located in the second region, of the polarization substrate; a second electrode layer 142, opposite to the first electrode layer 141 and configured to interact with the first electrode layer 141 to generate an electric field according to the applied electric signal; and an electrochromic material 143, located between the first electrode layer 141 and the second electrode layer 142 and configured to change transparency of the electrochromic material 143 according to the electric field generated between the first electrode layer 141 and the second electrode layer 142.

In the embodiment, both the first electrode layer 141 and the second electrode layer 142 may be thin film electrode layers, and the thin film electrode layer has high transparency and capability of applying and generating an electric field.

For example, a thin film layer electrode may include, but not limited to an N-type oxide semiconductor-Indium Tin Oxide (ITO) electrode. The voltages applied to the two electrode layers may be changed to change the electric field generated between the first electrode layer 141 and the second electrode layer 142.

In some embodiments, certain currents may be applied to the first electrode layer 141 and the second electrode layer 142 to change a color of the electrochromic material 143 under the action of different currents (equivalent to different electric fields).

Therefore, the electric signal between the first electrode layer 141 and the second electrode layer 142 may be controlled to conveniently control present transparency of the electrochromic component 14.

In some embodiments, the polarization substrate may include: a first surface, and a second surface, being opposite to the first surface, the second surface being a surface closer to the display component 12 than the first surface.

The first electrode layer 141 may be arranged in the second region of the first surface, or, the first electrode layer 141 may be arranged in the second region of the second surface.

In the embodiment, the second surface is a surface, closer to the display component 12, of the polarization substrate, which means that the second surface is located between the display component 12 and the first surface.

In the embodiment, the first electrode layer 141 is arranged in the second region of the first surface, or, the first electrode layer 141 is arranged in the second region of the second surface, namely the first electrode layer 141 may be located on any one of the two opposite surfaces of the polarization substrate.

For example, the polarization layer in the second region of the first surface of the polarization substrate may be removed, or, the polarization layer in the second region of the second surface of the polarization substrate may be removed, and then the first electrode layer 141 may be arranged in the second region, where the polarization layer is removed, of the first surface or second surface of the polarization substrate.

For another example, when the polarization component 13 is manufactured, the polarization layer may be only formed in the third region, except the second region, of the polarization component 13 through adhesion, coating or electroplating, etc. In such a manner, the second region for arrangement of the first electrode layer 141 may be directly reserved for arrangement of the first electrode layer 141.

In the embodiment, the touch component 15 includes a TP. The TP is configured to detect various touch operations, and the touch operations include, but not limited to, a clicking operation and/or a swipe operation, etc.

The first electrode layer 141 may be a transparent electrode layer sprayed in the second region of the first surface; or, the first electrode layer 141 may be a transparent electrode layer sprayed in the second region of the second surface.

In the embodiment, a transparent conductive material with liquidity may be arranged in the second region of the first surface or the second surface by a spraying process. Referring to FIG. 5, the first electrode layer 141 is arranged in the second region of the second surface of the polarization substrate in the polarization component 13; and the second electrode layer 142 is formed by an electrode of the touch component 15, namely the second electrode layer 142 reuses the touch electrode of the touch component 15, so that a structure of the display module is simplified, and the display module provided in the embodiment has a simple and exquisite structure.

In some embodiments, the electrochromic material may be sprayed onto the second electrode layer formed by the electrode of the touch component 15.

Referring to FIG. 6, the first electrode layer 141 may be an electrode layer arranged in the first region of the first surface of the polarization component 13, and the second electrode layer 142 may be an electrode layer sprayed to an inner surface of the cover glass 11.

In some embodiments, the electrochromic material located between the first electrode layer 141 and the second electrode layer 142 may be sprayed onto the second electrode layer 142.

In some embodiments, the electrochromic material 143 may be sprayed onto the first electrode layer 141.

Thickness uniformity of the first electrode layer 141 and/or the electrochromic material can be ensured by the spraying process, thereby guaranteeing quality of the display module, and getting a simple process achieved.

Referring to FIG. 5, the display module may further include: a touch component 15, located between the polarization component 13 and the display component 12 and configured to detect a touch operation; and a first transparent adhesive layer 16, configured to adhere the touch component 15 and the polarization component 13 and located in the display region outside the second region.

The first transparent adhesive layer 16 may have a first thickness such that a first accommodation space is formed between the touch component 15 and the polarization substrate, and the electrochromic component 14 is located in the first accommodation space.

The touch component 15 may include, but not limited to, a transparent TP; the touch operation may include, but not limited to, a clicking operation and/or a swipe operation.

In the embodiment, the first transparent adhesive layer 16 is transparent, and can fix the touch component 15 and the polarization component 13 by its adhesiveness.

In the embodiment, the first transparent adhesive layer 16 has the first thickness, and the thickness may be adapted to a thickness of the electrochromic component 14. In such case, the electrochromic component 14 is also located between the polarization substrate and the touch component 15, and the first electrode layer 141 is an upper electrode layer of the electrochromic component 14. Therefore, the first transparent adhesive layer 16 may not only serve to adhere the touch component 15 and the polarization component 13, but also have a supporting function, the supporting function ensuring that a gap between the touch component 15 and the polarization substrate is large enough to accommodate the electrochromic component 14.

In some embodiments, referring to FIG. 6, the display module may further include: the cover glass 11, located on the outer surface of the display module; and a second transparent adhesive layer 17, configured to adhere the cover glass 11 and the polarization component 13 and located in the display region outside the second region.

The second transparent adhesive layer 17 has a second thickness such that a second accommodation space is formed between the cover glass 11 and the polarization substrate, and the electrochromic component 14 is located in the second accommodation space.

In the embodiment, the cover glass 11 may be glass located on the whole outermost layer of the display module and serving to protect the whole display module. The cover glass 11 faces the display surface of the display module 12, and thus a user may see displaying of the display module through the cover glass 11.

In the embodiment, the electrochromic component 14 is located between the polarization substrate and the cover glass 11, and the first electrode layer located on the polarization substrate may be a lower electrode layer of the electrochromic component 14.

Similarly, in the embodiment, the second transparent adhesive layer 17 has a function of adhering the cover glass 11 and the polarization component 13, and on the other hand, also has a supporting function such that a gap between the cover glass 11 and the polarization component 13 is enough to accommodate the electrochromic component 14.

In the embodiment, the electrochromic component 14 introduced into the display module may be adjacent to the polarization component 13, and may present the first transparency in combination with a change in a working state of the display module when the display module is in the screen-on state and the image acquisition device is in the image acquisition state to reduce interference from the electrochromic component 14 to displaying and image acquisition; and in addition, the electrochromic component 14 may present the second transparency to reduce exposure of the display component 12 and/or the camera at a position where the polarization layer is not arranged.

The OLED display component 12 shown in FIG. 4, FIG. 5 and FIG. 6 may be one of the abovementioned display components 12.

Figure 7:
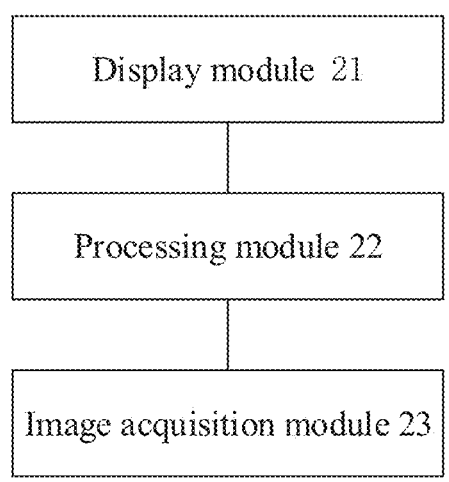
FIG. 7 is a schematic diagram of a display device, according to an exemplary embodiment.

FIG. 7 is a schematic diagram of a display device, according to an exemplary embodiment. As shown in FIG. 7, the display device includes: a display module 21, which may be any one of the above described display module; an image acquisition module 23, having a photosensitive surface for sensing ambient light to form an image, the photosensitive surface being capable of being covered with a first region of an inner surface of the display module 21; and a processing module 22 electrically connected with the display module 21 and the image acquisition module 23 and configured to control an electrochromic component in the display module 21 to present first transparency when the display module 21 is in a screen-on state or the image acquisition module 23 is in an image acquisition state, and present second transparency when the display module 21 is in a screen-off state, the second transparency being lower than the first transparency.

The display device may be a mobile device such as a mobile phone, a tablet or a wearable device.

The display module 21 of the display device may be the display module provided in any of the above embodiments and including the electrochromic component.

The processing module 22 may include one or more processors, and each processor may include, but not limited to, a central processing unit, a microprocessor, a Digital Signal Processor (DSP), a programmable array or an Application Specific Integrated Circuit (ASIC).

In some embodiments, the display module 21 may be an OLED display module.

According to the display device in the embodiment, since the display module provided in any abovementioned embodiment is adopted, no special space is required to be reserved in a display surface of the display module to expose the image acquisition module. In addition, the electrochromic component is introduced, and transparency of the electrochromic component is switched as follows: relatively high transparency is presented when the display module is in a screen-on state or the image acquisition module is in an image acquisition state, so that interference to the displaying of the display module and/or image acquisition of the image acquisition module is reduced; and relatively low transparency is presented when the display module is in a screen-off state, so that exposure of the image acquisition module and/or each component in the display module is reduced, integrated appearance of the display device is ensured, and integrity of the display device and the degree of satisfaction of a user are improved.

Figure 8:
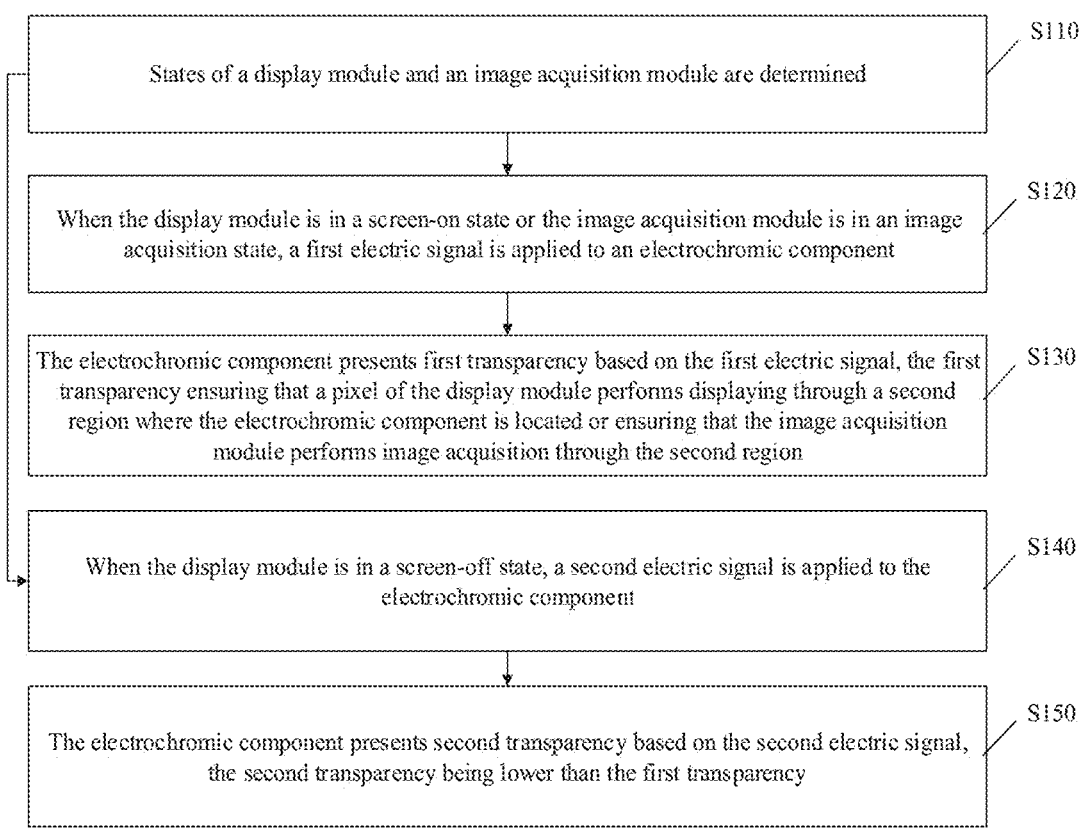
FIG. 8 is a flow chart of a control method for a display device according to an exemplary embodiment.

FIG. 8 is a flow chart of a control method for a display device according to an exemplary embodiment. As shown in FIG. 8, the control method for a display device includes the following steps.

In step S110, states of a display module and an image acquisition module are determined.

In step S120, when the display module is in a screen-on state or the image acquisition module is in an image acquisition module, a first electric signal is applied to an electrochromic component.

In step S130, the electrochromic component presents first transparency based on the first electric signal, the first transparency ensuring that a pixel of the display module performs displaying through a second region where the electrochromic component is located or ensuring that the image acquisition module performs image acquisition through the second region.

In step S140, when the display module is in a screen-off state, a second electric signal is applied to the electrochromic component.

In step S150, the electrochromic component presents second transparency based on the second electric signal, the second transparency being lower than the first transparency.

The display device may be user equipment, and the states of the display module and the image acquisition module may be determined based on input of a user. For example, a touch operation from a user over a touch component may be detected, or, various operations of the user over various physical buttons on an outer surface of the display device may be detected, and these operations may trigger the display module of the display device to be turned on or turned off or trigger the image acquisition module to enter the image acquisition state.

In the embodiment, transparency of the electrochromic component may be controlled to be switched according to the states of the display module and the image acquisition module, and the convenient implementation can be achieved.

In some embodiments, the method may further include that: when the display module is in the screen-on state and the image acquisition module is in the acquisition state, a turning-off signal is generated; and the display module controls a pixel in the second region to turn off based on the turning-off signal.

For example, the display module may include a driving circuit, and the driving circuit may provide a driving signal for displaying of each display pixel in the display module. After the turning-off signal is received, the driving circuit may be controlled to not provide the driving signal for the pixel in the second region, and then the pixel in the second region enters an off state of displaying nothing.

In some embodiments, when the display module is in the screen-off state, a polarization component of the display device may filter ambient light reflected from a display component based on a polarization action to enable a display region outside the second region to have third transparency, a transparency difference of the third transparency and the first transparency being within a preset range. The transparency difference of the third transparency and the first transparency may be within the preset range.

The transparency may be set to ensure higher integrity when the display module is in the screen-off state.

Some specific examples will be provided below in combination with any abovementioned embodiment.

Example 1

During photographing (i.e., image acquisition) of a display module provided in the example, an electrochromic material may be in a transparent state, and light on an outer side of the display module may enter a camera through the electrochromic material as much as possible. When a screen is turned on, the electrochromic material is in the transparent state, and light emitted by the OLED display screen (i.e., one of the abovementioned display components) may penetrate through the electrochromic material such that a display effect of a region where the camera (image acquisition component) is located is consistent with a display effect of another region.

When the OLED display screen is turned off, the electrochromic material is in an off state (dark), external light may not pass through the electrochromic material, and a camera region is in a black state, so that integrity of the screen is greatly improved.

In a photographic state (namely an image acquisition module is in an image acquisition state), the electrochromic material is in the transparent state, and external ambient light may pass through the electrochromic material to enter the camera, thereby ensuring a photographic effect.

When the OLED display screen is in a display mode (i.e., an on state), the electrochromic material is in the transparent state, and a content may be normally displayed in the camera region of the OLED display screen. Since brightness of the screen is far higher than brightness of reflected light of the camera, a user cannot see the camera actually, and the user feels that the screen is a whole.

When the OLED display screen is in a standby mode (i.e., an off state), the electrochromic material is in a nontransparent state, the ambient light may not pass through the electrochromic material, the user cannot see the camera, and the screen is a whole.

Example 2

The example provides a display module. In a camera region, an electrochromic material may be inserted between a touch component and cover glass of the display module. A polarizer with a polarization action may be sheared from a polarization component in the region, and the electrochromic material including an SPD material may be inserted to this position.

Example 3

The example provides a display module. An electrode layer of a touch component in a camera region is determined as a lower electrode layer of an electrochromic material, the electrochromic material may be sprayed onto the touch component, and an upper electrode layer (corresponding to the first electrode layer) may be sprayed to a bottom layer of a polarizer.

Example 4

The example provides a display module. A lower electrode layer in a camera region may be sprayed to an upper layer of a polarization material substrate (a polarization material is removed in the region), an electrochromic material may be sprayed onto an electrode layer of a polarizer, and an upper electrode layer may be sprayed to a bottom surface of cover glass.

According to the display modules provided in Example 2 to Example 4, the electrochromic material is automatically changed to integrate the camera region and non-camera region of the screen in the screen-off and screen-on states. When the camera works, the electrochromic material is in the transparent state, and light may penetrate through the electrochromic material to enter the camera as much as possible, thereby avoiding influence on a photographic effect. The camera may be a front camera, and the camera is the abovementioned image acquisition module.

Figure 9:
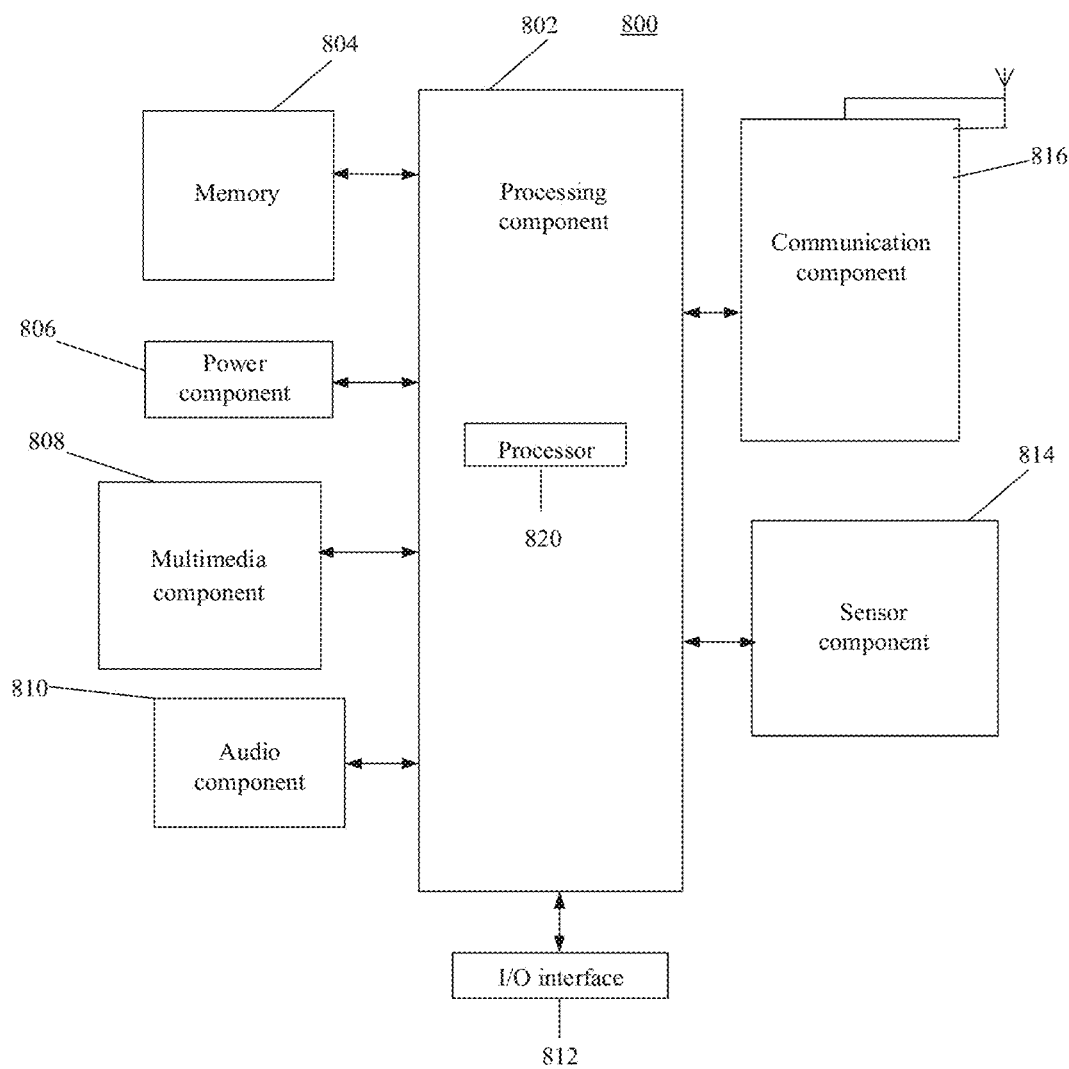
FIG. 9 is a block diagram of a display apparatus, according to an exemplary embodiment.

FIG. 9 is block diagram of a display apparatus 800, according to an exemplary embodiment. For example, the apparatus 800 may be a mobile phone, a computer, a digital broadcast terminal, a messaging device, a gaming console, a tablet, a medical device, exercise equipment, a personal digital assistant and the like.

Referring to FIG. 9, the apparatus 800 may include one or more of the following components: a processing component 802, a memory 804, a power component 806, a multimedia component 808, an audio component 810, an Input/Output (I/O) interface 812, a sensor component 814, and a communication component 816.

The processing component 802 typically controls overall operations of the apparatus 800, such as the operations associated with display, telephone calls, data communications, camera operations, and recording operations. The processing component 802 may include one or more processors 820 to execute instructions to perform all or part of the steps in the abovementioned method. Moreover, the processing component 802 may include one or more modules which facilitate interaction between the processing component 802 and other components. For instance, the processing component 802 may include a multimedia module to facilitate interaction between the multimedia component 808 and the processing component 802.

The memory 804 is configured to store various types of data to support the operation of the apparatus 800. Examples of such data include instructions for any application programs or methods operated on the apparatus 800, contact data, phonebook data, messages, pictures, video, etc. The memory 804 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 806 may provide power for various components of the apparatus 800. The power component 806 may include a power management system, one or more power supplies, and other components associated with generation, management and distribution of power for the apparatus 800.

The multimedia component 808 may include a screen for providing an output interface between the apparatus 800 and a user. In some embodiments, the screen may include a Liquid Crystal Display (LCD) and a TP. If the screen includes the TP, the screen may be implemented as a touch screen to receive an input signal from the user. The TP may include one or more touch sensors to sense touches, swipes and gestures on the TP. The touch sensors may not only sense a boundary of a touch or swipe action but also detect a duration and pressure associated with the touch or swipe action. In some embodiments, the multimedia component 808 may include a front camera and/or a rear camera. The front camera and/or the rear camera may receive external multimedia data when the apparatus 800 is in an operation mode, such as a photographing mode or a video mode. Each of the front camera and the rear camera may be a fixed optical lens system or have focusing and optical zooming capabilities.

The audio component 810 is configured to output and/or input an audio signal. For example, the audio component 810 may include a Microphone (MIC), and the MIC is configured to receive an external audio signal when the apparatus 800 is in the operation mode, such as a call mode, a recording mode and a voice recognition mode. The received audio signal may further be stored in the memory 804 or sent through the communication component 816. In some embodiments, the audio component 810 may further include a speaker configured to output the audio signal.

The I/O interface 812 may provide an interface between the processing component 802 and a peripheral interface module, and the peripheral interface module may be a keyboard, a click wheel, a button and the like. The button may include, but not limited to: a home button, a volume button, a starting button and a locking button.

The sensor component 814 may include one or more sensors configured to provide status assessment in various aspects for the apparatus 800. For instance, the sensor component 814 may detect an on/off status of the apparatus 800 and relative positioning of components, such as a display and small keyboard of the apparatus 800, and the sensor component 814 may further detect a change in a position of the apparatus 800 or a component of the apparatus 800, presence or absence of contact between a user and the apparatus 800, orientation or acceleration/deceleration of the apparatus 800 and a change in temperature of the apparatus 800. The sensor component 814 may include a proximity sensor configured to detect presence of an object nearby without any physical contact. The sensor component 814 may also include a light sensor, such as a Complementary Metal Oxide Semiconductor (CMOS) or Charge Coupled Device (CCD) image sensor, configured for use in an imaging application. In some embodiments, the sensor component 814 may also include an acceleration sensor, a gyroscope sensor, a magnetic sensor, a pressure sensor or a temperature sensor.

The communication component 816 is configured to facilitate wired or wireless communication between the apparatus 800 and other equipment. The apparatus 800 may access a communication-standard-based wireless network, such as a Wireless Fidelity (WiFi) network, a 4th-Generation (4G) or 5th-Generation (5G) network or a combination thereof. In an exemplary embodiment, the communication component 816 may receive a broadcast signal or broadcast associated information from an external broadcast management system through a broadcast channel In an exemplary embodiment, the communication component 816 may further include a Near Field Communication (NFC) module to facilitate short-range communication. In an exemplary embodiment, the communication component 816 may be implemented based on a Radio Frequency Identification (RFID) technology, an Infrared Data Association (IrDA) technology, an Ultra-WideB and (UWB) technology, a Bluetooth (BT) technology and another technology.

In an exemplary embodiment, the apparatus 800 may be implemented by one or more ASICs, DSPs, Digital Signal Processing Devices (DSPDs), Programmable Logic Devices (PLDs), Field Programmable Gate Arrays (FPGAs), controllers, micro-controllers, microprocessors or other electronic components, and is configured to execute the abovementioned method.

In an exemplary embodiment, there is also provided a non-transitory computer-readable storage medium including an instruction, such as the memory 804 including an instruction, and the instruction may be executed by the processor 820 of the apparatus 800 to implement the above described method. For example, the non-transitory computer-readable storage medium may be a ROM, a Random Access Memory (RAM), a Compact Disc Read-Only Memory (CD-ROM), a magnetic tape, a floppy disc, an optical data storage device and the like.

When an instruction in the storage medium is executed by a processor of a display device, the display device is caused to execute the above described display device control method, for example, the method shown in FIG. 8.

Other implementation solutions of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A display module, comprising:
a cover glass, located on an outer surface of the display module and configured to protect the display module, wherein a first region of an inner surface of the display module covers a photosensitive surface of an image acquisition module, and the inner surface of the display module is a surface opposite to the outer surface of the display module; a display component, configured to display in a display region;
a polarization component, located between the display component and the cover glass and configured to filter ambient light reflected from the display component based on a polarization action in the display region outside a second region, wherein the second region is a region covering the first region in the display module; and
an electrochromic component, located between the cover glass and the display component, adjacent to the polarization component and filling the second region,
wherein the electrochromic component is configured to, based on an applied electric signal, present first transparency when the display module is in a screen-on state or the image acquisition module is in an image acquisition state and present second transparency when the display module is in a screen-off state, the second transparency being lower than the first transparency.

2. The display module of claim 1, wherein
the polarization component is configured to achieve third transparency by filtering the ambient light reflected from the display component based on the polarization action when the display module is in the screen-off state, a difference of the second transparency and the third transparency being within a preset range.

3. The display module of claim 1, wherein the polarization component comprises:
a polarization substrate; and
a polarization layer, arranged on the polarization substrate and having the polarization action, the polarization layer being located in the display region outside the second region.

4. The display module of claim 2, wherein the polarization component comprises:
a polarization substrate; and
a polarization layer, arranged on the polarization substrate and having the polarization action, the polarization layer being located in the display region outside the second region.

5. The display module of claim 3, wherein
the polarization substrate is located in the display region outside the second region; and
the electrochromic component and the polarization component are arranged in parallel in a plane parallel to the display module.

6. The display module of claim 4, wherein
the polarization substrate is located in the display region outside the second region; and
the electrochromic component and the polarization component are arranged in parallel in a plane parallel to the display module.

7. The display module of claim 3, wherein
the polarization substrate is located in the whole display region; and
the electrochromic component comprises:
a first electrode layer, covering a portion, located in the second region, of the polarization substrate,
a second electrode layer, opposite to the first electrode layer and configured to interact with the first electrode layer to generate an electric field according to the applied electric signal, and
an electrochromic material, located between the first electrode layer and the second electrode layer and configured to change transparency of the electrochromic material according to the electric field generated between the first electrode layer and the second electrode layer.

8. The display module of claim 4, wherein
the polarization substrate is located in the whole display region; and
the electrochromic component comprises:
a first electrode layer, covering a portion, located in the second region, of the polarization substrate,
a second electrode layer, opposite to the first electrode layer and configured to interact with the first electrode layer to generate an electric field according to the applied electric signal, and
an electrochromic material, located between the first electrode layer and the second electrode layer and configured to change transparency of the electrochromic material according to the electric field generated between the first electrode layer and the second electrode layer.

9. The display module of claim 7, wherein the polarization substrate comprises:
a first surface, and
a second surface, being a surface opposite to the first surface and closer to the display component than the first surface;
wherein the first electrode layer is arranged in the second region of the first surface, or, the first electrode layer is arranged in the second region of the second surface.

10. The display module of claim 8, wherein the polarization substrate comprises:
a first surface, and
a second surface, being a surface opposite to the first surface and closer to the display component than the first surface;
wherein the first electrode layer is arranged in the second region of the first surface, or, the first electrode layer is arranged in the second region of the second surface.

11. The display module of claim 9, wherein
the first electrode layer is a transparent electrode layer sprayed in the second region of the first surface; or,
the first electrode layer is a transparent electrode layer sprayed in the second region of the second surface.

12. The display module of claim 10, wherein
the first electrode layer is a transparent electrode layer sprayed in the second region of the first surface; or,
the first electrode layer is a transparent electrode layer sprayed in the second region of the second surface.

13. The display module of claim 11, wherein the electrochromic material is sprayed onto the first electrode layer.

14. The display module of claim 12, wherein the electrochromic material is sprayed onto the first electrode layer.

15. The display module of claim 9, further comprising:
a touch component, located between the polarization component and the display component and configured to detect a touch operation; and
a first transparent adhesive layer, configured to adhere the touch component and the polarization component and located in the display region outside the second region,
wherein the first transparent adhesive layer has a first thickness which enables a first accommodation space to be formed between the touch component and the polarization substrate, and the electrochromic component is located in the first accommodation space.

16. The display module of claim 10, further comprising:
a touch component, located between the polarization component and the display component and configured to detect a touch operation; and
a first transparent adhesive layer, configured to adhere the touch component and the polarization component and located in the display region outside the second region,
wherein the first transparent adhesive layer has a first thickness which enables a first accommodation space to be formed between the touch component and the polarization substrate, and the electrochromic component is located in the first accommodation space.

17. The display module of claim 9, further comprising:
a second transparent adhesive layer, configured to adhere the cover glass and the polarization component and located in the display region outside the second region, wherein
the second transparent adhesive layer has a second thickness which enables a second accommodation space to be formed between the cover glass and the polarization substrate, and the electrochromic component is located in the second accommodation space.

18. The display module of claim 10, further comprising:
a second transparent adhesive layer, configured to adhere the cover glass and the polarization component and located in the display region outside the second region, wherein
the second transparent adhesive layer has a second thickness which enables a second accommodation space to be formed between the cover glass and the polarization substrate, and the electrochromic component is located in the second accommodation space.

19. A display device, comprising: a display module, comprising:
a cover glass, located on an outer surface of the display module and configured to protect the display module, wherein the outer surface of the display module is a surface opposite to an inner surface of the display module;
a display component, configured to display in a display region; a polarization component, located between the display component and the cover glass and configured to filter ambient light reflected from the display component based on a polarization action in the display region outside a second region, wherein the second region is a region covering a first region of the inner surface of the display module; and
an electrochromic component, located between the cover glass and the display component, adjacent to the polarization component and filling the second region,
wherein the electrochromic component is configured to, based on an applied electric signal, present first transparency when the display module is in a screen-on state or the image acquisition module is in an image acquisition state and present second transparency when the display module is in a screen-off state, the second transparency being lower than the first transparency;
an image acquisition module, having a photosensitive surface for sensing ambient light to form an image, the photosensitive surface being covered by the first region of the inner surface of the display module; and
a processing module electrically connected with the display module and the image acquisition module and configured to control the electrochromic component in the display module to present the first transparency when the display module is in the screen-on state or the image acquisition module is in the image acquisition state, and present the second transparency when the display module is in the screen-off state.

20. The display device of claim 19, wherein the polarization component is configured to achieve third transparency by filtering the ambient light reflected from the display component based on the polarization action when the display module is in the screen-off state, a difference of the second transparency and the third transparency being within a preset range.

* * * * *